United States Patent [19]
Latasiewicz et al.

[11] Patent Number: 4,577,259
[45] Date of Patent: Mar. 18, 1986

[54] APPARATUS AND METHOD FOR RETAINING AN ELECTRONIC DEVICE

[75] Inventors: Leonard Latasiewicz, Hoffman Estates; Felix B. Melikian, Niles; Bay E. Estes, III, Palatine, all of Ill.

[73] Assignee: Motorola, Inc., Schaumburg, Ill.

[21] Appl. No.: 492,519

[22] Filed: May 9, 1983

[51] Int. Cl.$^4$ .............................................. H05K 7/02
[52] U.S. Cl. .................................... 361/400; 361/403; 174/138 G
[58] Field of Search ............... 361/394, 395, 400, 417, 361/419, 420; 174/52 R, 138 G; 357/80

[56] References Cited

U.S. PATENT DOCUMENTS 4,219,172  8/1980  Murayama .................... 174/138 G

FOREIGN PATENT DOCUMENTS 3023642  1/1982  Fed. Rep. of Germany ...... 361/400
762220   9/1980  U.S.S.R. .............................. 361/417

OTHER PUBLICATIONS

"Light-Emitting Diode Mounting Block", IBM TDB, vol. 15, No. 1, Jun. 72.

Primary Examiner—Vit W. Miska
Attorney, Agent, or Firm—Donald B. Southard; Steven G. Parmelee

[57] ABSTRACT

Apparatus and method for retaining an electronic device having an encapsulated body portion of a generally uniform cross section by means of a socket assembly having a plurality of deformable ribs extending medially therein. The electronic device, in particular an LED is inserted into the cavity for frictional retention therein by deformably engaging the ribs of the socket assembly. Critical height spacing of the LED is retained yet the deformable ribs allow for thermal expansion and contraction of the device body and leads without placing undue stress on its lead/die interface.

7 Claims, 11 Drawing Figures

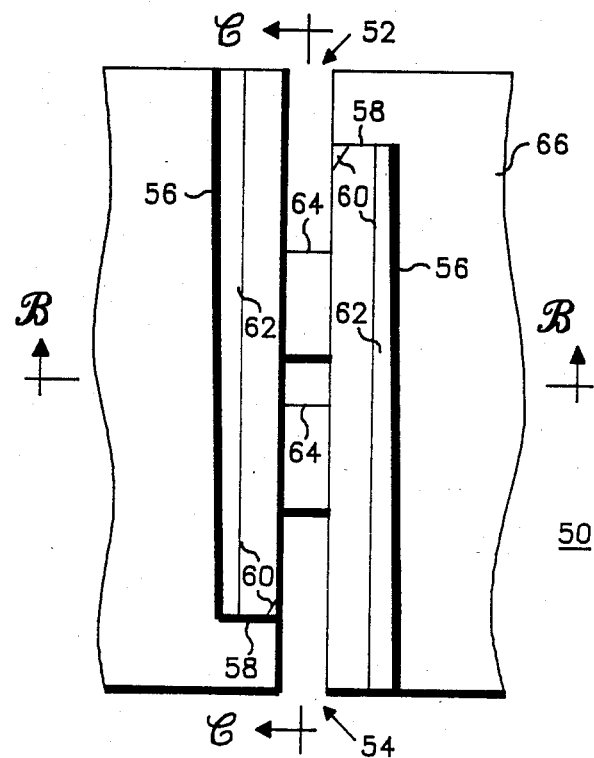
Fig. 5A
Fig. 5B
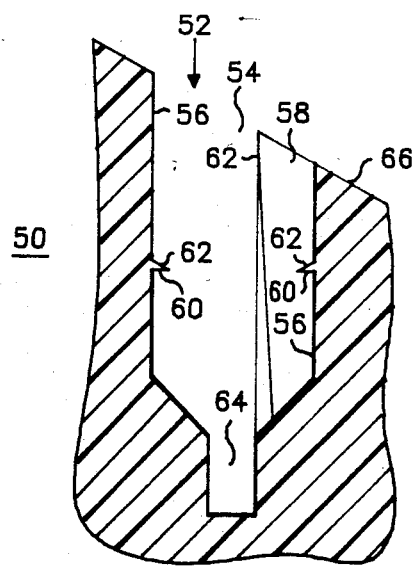
Fig. 5C
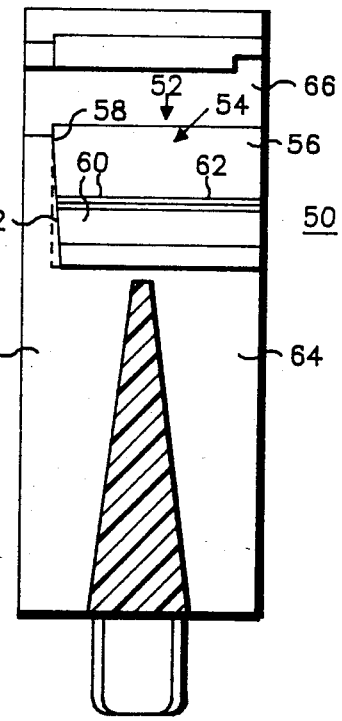

APPARATUS AND METHOD FOR RETAINING AN ELECTRONIC DEVICE

BACKGROUND OF THE INVENTION

The present invention relates, in general, to the field of electronic devices and apparatus and methods for retaining the same. More particularly, the present invention is of especial utility in retaining an electronic device such as a light emitting diode (LED) having an encapsulated body portion which must be physically maintained in a generally fixed position relative to an indicator panel yet simultaneously allow for the thermal expansion and contraction of the device body and leads thereof without placing undue stress on its lead/die interface.

In the mounting of certain electronic devices, and in particular LEDs, a specific height spacing for the device upper end is desired to ensure a generally uniform plane surface between adjacent devices and an indicator panel. Unfortunately, because the encapsulated body portion of an LED is made of poured epoxy, the physical height of the device itself from bottom end to top end can vary by up to 40 mils (1.016 mm) rendering the bottom end, for the most part, useless as a mounting reference level. This fact makes the maintenance of a controlled height to the top of the LED very difficult when dealing with generally rectangular LEDs. To deal with this variability in device body height, certain cylindrical LEDs have an integral annular flange around their periphery to provide a constant dome-to-flange height whereby the device may be mounted through a panel hole such that the variability as to the overall device height becomes unimportant. However, these flanged devices, therefore, require a more costly and complex mounting structure than those having a generally rectangular cross section.

Another problem which must be dealt with in the mounting of LEDs by rigidly fixing the device body height to maintain height spacing is that of thermal expansion of the epoxy or plastic body with respect to the device leads. Under normal thermal conditions such as soldering, device operation or mere proximity to other heat-producing components, a great deal of stress may be experienced at the lead/die interface of the device. This stress results from the fact that the plastic device body has a coefficient of thermal expansion which may be up to ten times that of the device leads. Therefore, rigidly affixing the device body height to fix the plane of the LED top can result in premature device failure at the lead/die interface due to this stress. In light of this fact, it has been the practice to use lead bending techniques to ensure that sufficient lead length is maintained between a device body portion and the printed circuit board to which it is soldered such that the device body and leads can expand relatively independently and thereby reduce stress on the lead/die interface. As is easily perceived however, this technique introduces at least another extra and undesirable assembly step and further complicates the expeditious insertion of the LED leads to a printed circuit board by, of necessity, introducing a variable into the LEDs intralead spacing.

It is therefore an object of the invention to provide an improved retaining apparatus and method for an electronic device.

It is further an object of the present invention to provide an improved retaining apparatus and method for an electronic device which allows for uniform height spacing of the device despite variations among devices in their dimensional parameters.

It is still further an object of the present invention to provide an improved retaining apparatus and method for an electronic device which does not require lead forming to compensate for thermal stress at a lead/die interface.

It is still further an object of the present invention to provide an improved retaining apparatus and method for an electronic device which is adaptable to devices having a generally uniform cross section of any geometrical shape.

It is still further an object of the present invention to provide an improved retaining apparatus and method for an electronic device which may be fabricated with lead guides for ease of insertion and subsequent soldering of the device leads to a printed circuit board.

SUMMARY OF THE INVENTION

The foregoing and other objects of the invention are achieved in the present invention wherein there is provided a retaining apparatus for an electronic device having an encapsulated body portion of a generally uniform cross section comprising a socket assembly having a cavity for receiving the device body portion, the cavity having an interior periphery thereof of a greater cross sectional dimension than the device body portion. A plurality of deformable ribs extend medially from a proximal portion thereof on the interior periphery of the cavity to a distal portion thereof defining a lesser cross sectional dimension than the device body portion, the ribs having a beveled edge thereof adjacent an opening to the cavity. The device body portion may then be inserted into the opening for frictional retention within the cavity by deformably engaging the ribs at the distal portion thereof.

Also provided is a method in accordance with the present invention for retaining an electronic device having an encapsulated body portion of a generally uniform cross section which comprises the steps of providing a socket assembly having a cavity for receiving the device body portion, the cavity having an interior periphery thereof of a greater cross sectional dimension than the device body portion. A plurality of deformable ribs are medially extended from a proximal portion thereof on the interior periphery of the cavity to a distal portion thereof defining a lesser cross sectional dimension than the device body portion, the ribs having a beveled edge thereof adjacent an opening to the cavity. The device body portion is thereafter inserted into the opening for friction retention within the cavity by deformably engaging the ribs at the distal portion thereof.

BRIEF DESCRIPTION OF THE DRAWINGS

The above-mentioned, and other features and objects of the invention and the manner of attaining them will become more apparent and the invention itself will be best understood by reference to the following description of an embodiment of the invention taken in conjunction with the accompanying drawings, wherein:

FIGS. 1A, 1B and 1C illustrate an electronic device, for example an LED, for use in conjunction with an embodiment in accordance with the present invention and illustrating the height, depth and width dimensional parameters of the LED respectively;

FIG. 5A is a partial top view of an alternative embodiment of a retaining apparatus in accordance with the present invention for use with the LED of FIGS. 1A, 1B and 1C;

FIG. 5B is a cutaway end view of the embodiment of FIG. 5A taken substantially along section line C—C; and FIG. 5C is a cutaway side plan view of the embodiment of FIGS. 5A and 5B taken substantially along section line D—D.

DESCRIPTION OF A PREFERRED EMBODIMENT

Figure 1C:
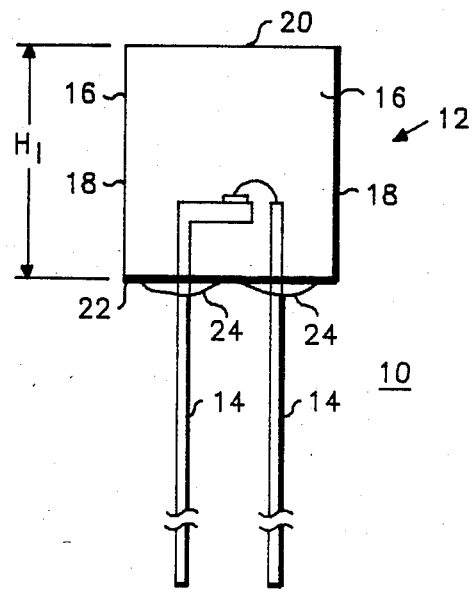
Figure 1C:
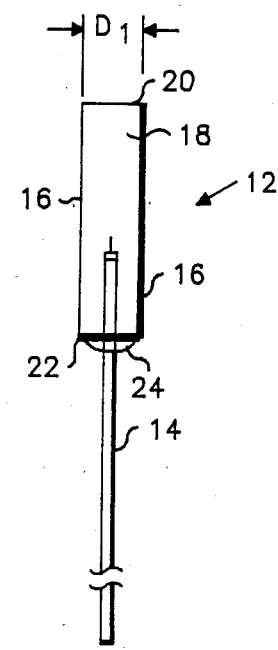
Figure 1C:
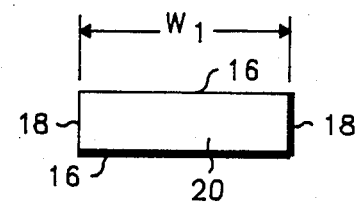

Referring to FIGS. 1A, 1B and 1C, three views of an electronic device comprising an LED 10 are shown. LED 10 comprises in pertinent part a body portion 12 encapsulating a light emitting semiconductor and a pair of leads 14. Body portion 12 which is usually constructed of a translucent, poured epoxy or plastic, is of a generally rectangular cross section and includes generally parallel and opposite faces 16, ends 18, and an upper end 20 and opposite lower end 22. A pair of menisci 24 adjoin the intersection of leads 14 with lower end 22 due to the poured construction of the LED 10 body portion 12. Body portion 12 will generally have a width, $W_1$ of approximately $295\pm10$ mils ($7.493\pm0.254$ mm). Body portion 12 will additionally present a depth, $D_1$, of approximately $95\pm5$ mils ($2.413\pm0.127$ mm). The height, $H_1$, of body portion 12 is generally on the order of 300 mils (7.62 mm) but may vary up to 40 mils (1.016 mm).

Figure 2:
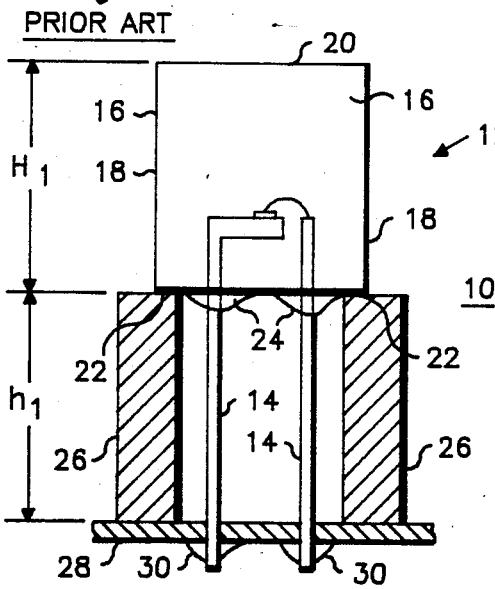
FIG. 2 illustrates a prior art mounting technique for the electronic device of FIGS. 1A, 1B and 1C for demonstrating the inherent thermal expansion problems thereof and the difficulties in obtaining uniform height spacing of the LED.

Referring additionally now to FIG. 2, a prior art mounting technique for an LED 10 is shown. As the illumination from LED 10 is generally viewed from upper end 20, it is most desirable that upper end 20 be maintained at a specific height spacing with regard to adjacent devices or an indicator panel. Because the device height, $H_1$, may vary by up to 40 mils (1.016 mm) the prior art mounting technique shown has obvious disadvantages. In this technique, LED 10 has its height spacing to upper end 20 maintained by supporting the body portion 12 of the device by means of a pair of supports 26 of a height, $h_1$. Supports 26 serve to mount body portion 12 of LED 10 at lower end 22 thereof. Leads 14 extend through holes within printed circuit board 28 for electrical connection to the metal interconnects thereof by means of solder 30. By means of the mounting technique shown, a fixed support height, $h_1$, will result in a variable height spacing amongst various LEDs, 10, having an inherently variable device height, $H_1$. Moreover, due to normal thermal operating conditions of an LED 10 such as soldering, device operation or proximity to other heat producing components, a great deal of stress may be experienced at the lead die interface thereof due to the varying coefficients of thermal expansion between body portion 12 and leads 14 in conjunction with supports 26. In general, body portion 12 will have a coefficient of expansion approximately 10 times that of leads 14. For these reasons, the mounting technique shown has proven unsatisfactory.

Figure 3:
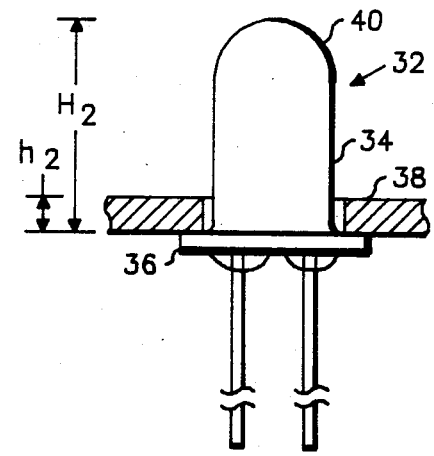
FIG. 3 illustrates an alternative prior art technique employing a differently encapsulated LED for solving some of the problems inherent in the technique of FIG. 2.

With reference now to FIG. 3, an alternative prior art mounting technique for a cylindrical LED 32 is shown. Cylindrical LED 32 comprises in pertinent part a body portion 34 having a peripherally surrounding annular flange 36 molded therewith. Due to the mold employed in the construction of body portion 34 and annular flange 36, a constant dome 40 to annular flange 36 height, $H_2$ is maintained. In this manner, a generally uniform height spacing of cylindrical LED 32 may be maintained by inserting body portion 34 through a hole in a mounting board 38 of a thickness, $h_2$, thereby resulting in a cylindrical LED 32 height above mounting board 38 of $H_2-h_2$. As can be seen, the mounting technique of FIG. 3 results in a protrusion of the dome 40 through mounting board 38 thus necessitating an additional indicator panel at that level unless the protrusion of the dome therethrough can be tolerated. Moreover, the technique illustrated is for obvious reasons inapplicable to the generally rectangular LED 10 of FIGS. 1A, 1B, 1C and 2.

Figure 4A:
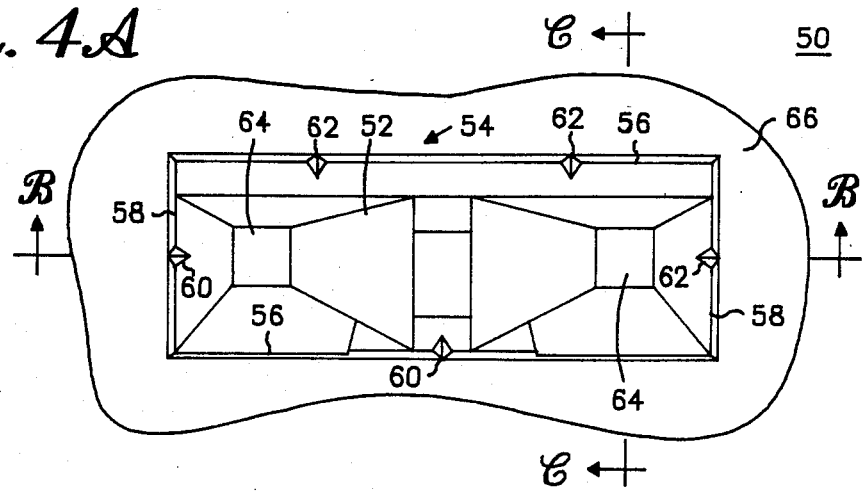
FIG. 4A is a partial top plan view of a retaining apparatus in accordance with the present invention for the LED of FIGS. 1A, 1B and 1C.
Figure 4B:
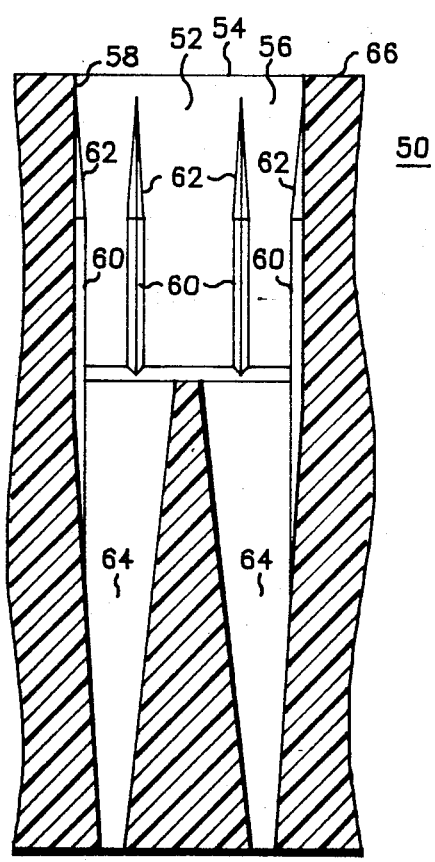
FIG. 4B is a cutaway side plan view of the embodiment of FIG. 4A taken substantially along section line A—A.
Figure 4C:
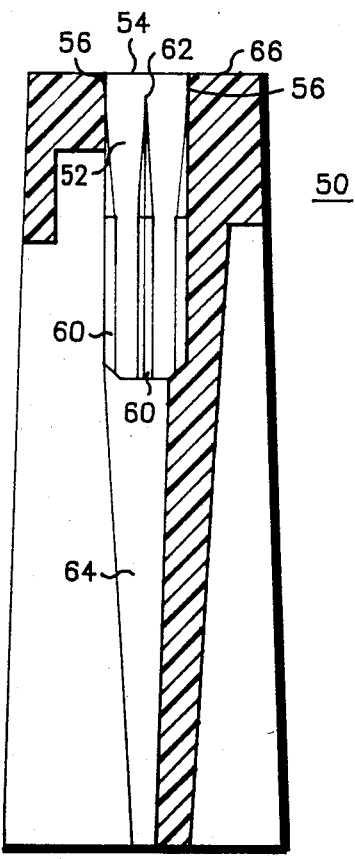
FIG. 4C is a cutaway end view of the embodiment of FIGS. 4A and 4B taken substantially along section line B—B.

Referring additionally now to FIGS. 4A, 4B and 4C a retaining apparatus 50 in accordance with the present invention is shown. Retaining apparatus 50 is of especial utility with the LED 10 of FIGS. 1A, 1B and 1C. Retaining apparatus 50 comprises an electronic device support which may be affixed to a printed circuit board (not shown) and aligned with an indicator panel for retaining an electronic device. As illustrated, retaining apparatus 50 comprises in pertinent part a cavity 52 having an opening 54 through an upper surface 66. A plurality of retaining apparatus 50 may be provided in a single upper surface 66 for retaining a like plurality of electronic devices at a controlled and uniform height spacing. In general, cavity 52 and opening 54 will be of physical dimensions somewhat greater than width, $W_1$, and depth, $D_1$, of LED 10 as illustrated in FIGS. 1A, 1B and 1C. Likewise, cavity 52 will be of sufficient interior dimensions to accommodate height, $H_1$, of LED 10. As illustrated, cavity 52 presents generally parallel and opposite interior faces 56 and, perpendicularly disposed thereto, generally parallel and opposite interior ends 58.

A plurality of deformable ribs 60 extend from a proximal portion adjacent interior faces 56 and interior ends 58 to a distal portion thereof extending medially within the interior of cavity 52. Deformable ribs 60 will, in general, extend a distance of approximately 15 mils (0.381 mm) from their proximal portion to their distal portion thereof. Deformable ribs 60 also present a beveled portion 62 adjacent opening 54 to facilitate the insertion of an electronic device through opening 54 into cavity 52. To facilitate lead insertion and subsequent soldering of an electronic device to a printed circuit board to which retaining apparatus 50 is secured, a pair of lead guides 64 extend from cavity 52 to the printed circuit board (not shown). Lead guides 64 serve to channel the electronic device leads to the proper location on the printed circuit board thereby obviating a separate alignment of the device leads.

For use with LED 10 of FIGS. 1A, 1B and 1C, LED 10 would be inserted through opening 54 of retaining apparatus 50 with leads 14 thereof entering first. Leads 14 would then be extended through lead guides 64 whereupon body portion 12 of LED 10 will initially contact deformable ribs 60 at their beveled portion 62 thereof at lower end 22 of body portion 12. As body portion 12 is further inserted into cavity 52, deformable ribs 60 conformally adjoin faces 16 and ends 18 of body portion 12. In this manner, LED 10 is generally frictionally maintained within cavity 52 such that a plane surface may be maintained across upper end 20 of LED 10 and upper surface 66 of retaining apparatus 50. Moreover, because LED 10 is not rigidly affixed to retaining apparatus 50 thermal expansion of body portion 12 may be accommodated within cavity 52 such that undue stress on the device lead/die interface is obviated.

Referring additionally now to FIGS. 5A, 5B and 5C, an alternative embodiment of a retaining apparatus 50 is illustrated. In this embodiment, like structure to that above described with respect to FIGS. 4A, 4B and 4C is like numbered and the foregoing description thereof will suffice as a description herefor. In this embodiment of retaining apparatus 50, deformable ribs 60 extend both horizontally and vertically within cavity 52 to maintain a body portion 12 of an LED 10 therein in much the same manner as the generally longitudinally extending deformable ribs 60 of FIGS. 4A, 4B and 4C. In this embodiment, however, upper surface 66 is shown as intersecting the longitudinal axis of cavity 52 at an oblique angle thereto. In this manner, an upper end 20 of LED 10 would protrude through opening 54 in a stairstep-like fashion.

With respect to the retaining apparatus 50 of FIGS. 4A, 4B, 4C, 5A, 5B and 5C a mineral glass filled fire-retardant nylon such as Minlon FR-60 available from E. I. DuPont Company may be utilized. Such mineral glass filled nylon has an inherently low coefficient of thermal expansion and provides a suitable material for formation of deformable ribs 60 such that an LED 10 may be frictionally and conformally maintained within cavity 52 of retaining apparatus 50.

What has been provided, therefore, is an improved retaining apparatus and method for an electronic device which allows for uniform height spacing of the device despite variations among devices in their dimensional parameters. Further, by the apparatus and method of the present invention an electronic device does not require lead forming to compensate for thermal stress which might otherwise adversely impact its lead/die interface. The improved retaining apparatus and method of the present invention is adaptable to devices having a generally uniform cross section of any geometrical shape and may be fabricated with lead guides for ease of insertion and subsequent soldering of the device leads to a printed circuit board.

While there have been described above the principles of this invention in conjunction with specific apparatus, it is to be clearly understood that this description is made only by way of example and not as a limitation to the scope of the invention. Particularly, it is readily seen that the retaining apparatus and method of the present invention is easily adaptable to an electronic device of any generally uniform cross section and is not limited to the above described rectangular light emitting diode.

We claim:

1. A retaining apparatus for an electronic device comprised of a housing for completely encapsulating said device and at least one conductive lead operably connected to said device and extending from said housing, wherein said housing has a substantially uniform cross section, and further having no grooves formed therein and having no flanges formed on or attached thereto, said apparatus comprising:
   a socket assembly having a first end and a second end, and including a cavity formed in said first end for receiving said housing, said cavity having a total interior periphery thereof of a greater cross sectional dimension than said housing, and at least one hole formed in said second end in communication with said cavity for receiving said lead; and
   a plurality of deformable ribs extending medially from a proximal portion thereof on said interior periphery of said cavity to a distal portion thereof defining a lesser cross sectional dimension than said housing, said ribs having a beveled edge thereof adjacent an opening to said cavity
   whereby said housing may be inserted into said opening and retained in position within said cavity solely by deformably engaging said ribs at said distal portion thereof.

2. The retaining apparatus of claim 1 wherein said electronic device is an LED.

3. The retaining apparatus of claim 2 wherein said LED has a generally rectangular cross section.

4. The retaining apparatus of claim 1 wherein said socket assembly is formed of a mineral glass filled nylon.

5. The retaining apparatus of claim 1 wherein said deformable ribs include at least two thereof parallel to a longitudinal axis of said cavity.

6. The retaining apparatus of claim 5 wherein said deformable ribs include others thereof perpendicular to said longitudinal axis.

7. The retaining apparatus of claim 1 further including lead guides extending from said cavity for facilitating insertion of electrical leads from said electronic device to a printed circuit board.

* * * * *